United States Patent [19]

Duffy

[11] 4,335,781

[45] Jun. 22, 1982

[54] HIGH POWER COOLER AND METHOD THEREOF

[75] Inventor: Victor P. Duffy, Scottsdale, Ariz.

[73] Assignee: Motorola Inc., Schaumburg, Ill.

[21] Appl. No.: 214,829

[22] Filed: Dec. 9, 1980

Related U.S. Application Data

[63] Continuation of Ser. No. 947,672, Oct. 2, 1978, abandoned.

[51] Int. Cl.³ .................... F28D 15/00; F28D 21/00
[52] U.S. Cl. .......................................... 165/1; 165/10;
     165/41; 165/104.21; 165/104.33; 361/385;
     357/82
[58] Field of Search ........... 165/104 S, 104, 1, 105.41,
     165/104.21, 10, 104.33; 361/385; 357/82

[56] References Cited

U.S. PATENT DOCUMENTS

| | | | |
|---|---|---|---|
| 2,825,034 | 2/1958 | Birchard | 165/104 S X |
| 3,112,877 | 12/1963 | Snelling | 165/104 S X |
| 3,270,250 | 8/1966 | Davis | 361/385 |
| 3,328,642 | 6/1967 | Haumesser et al. | 165/104 S X |
| 3,489,207 | 1/1970 | Miller | 357/82 X |
| 3,651,865 | 3/1972 | Feldmanis | 361/385 X |
| 4,057,101 | 11/1977 | Ruba et al. | 165/104 S X |

*Primary Examiner*—Albert W. Davis
*Attorney, Agent, or Firm*—Eugene A. Parsons; M. David Shapiro

[57] ABSTRACT

A high power cooler for absorbing heat from a high power source such as electronic components is especially applicable to airborne missiles wherein a cold plate is not available and the thermal energy produced by the high power source must be totally absorbed by the high power cooler. The cooler utilizes a reflux boiler for rapid assimilation of heat from the high power source and a condenser comprised of a plurality of honeycomb cells containing a heat of fusion coolant such as beeswax for absorbing heat from the vapors produced in the boiler causing the wax to melt and the vapors to return to the liquid state.

8 Claims, 3 Drawing Figures

U.S. Patent  Jun. 22, 1982  4,335,781
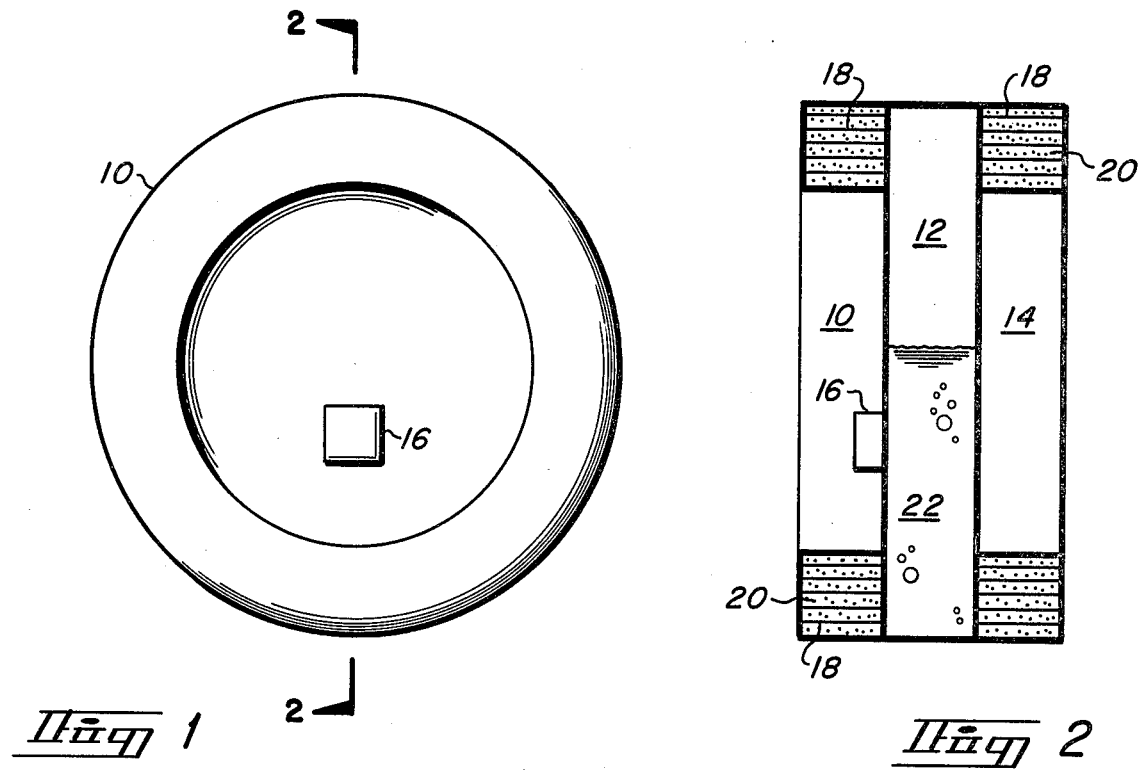
Fig. 1
Fig. 2
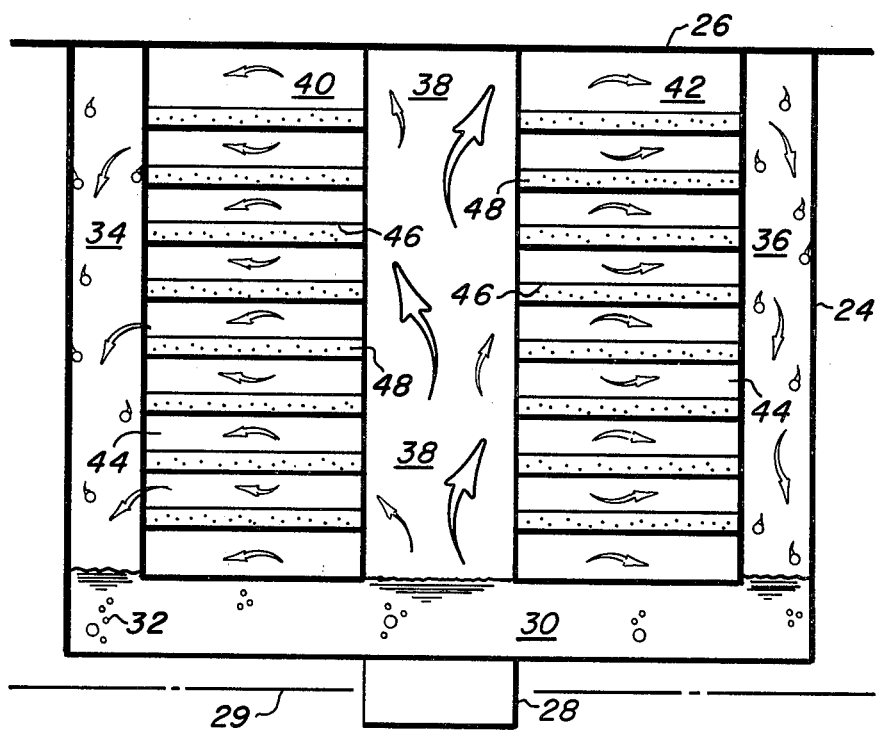
Fig. 3

HIGH POWER COOLER AND METHOD THEREOF

This is a continuation of application Ser. No. 947,672, filed Oct. 2, 1978, now abandoned.

BACKGROUND OF THE INVENTION

This invention relates to heat absorption devices, and more particularly to closed system heat absorption devices.

As is well known, high powered electronic components require some type of heat dissipating apparatus in order to prevent catastrophic thermal build-up inside the device. Most thermal dissipating devices in the past have provided a low thermal resistance between the electronic component and a remote cold plate or a heat dissipating fluid such as air or water. However these apparatus are not usable in most airborne missile applications since a cold plate or a cooling fluid is not available. Moreover, the cooling of electronic components in a missile is complicated first, by the infiltration of heat from the skin of the missile since the missile in operation travels at a high mach number, and second by physical constraints of the missile making packaging volume a premium.

Therefore it can be appreciated that a high power cooling apparatus which operates to remove heat sufficiently fast from electronic components in order to keep the temperature in the components below a certain level and also acts as a heat storage reservoir in a limited amount of space inside an airborne missile is highly desirable.

SUMMARY OF THE INVENTION

Accordingly, it is an object of this invention to provide a high power closed system cooling apparatus suitable for use in an airborne missile.

It is also an object of this invention to provide an airborne missile cooler which can dissipate heat rapidly from electronic components.

It is also an object of this invention to provide a closed system cooling apparatus which is reusable in nature.

It is still another object of this invention to provide a method for cooling high powered electronic components in an airborne missile.

An illustrated embodiment of the invention provides a closed cooling system for dissipating heat from a thermal source which comprises a reflux boiler, a boilable liquid inside the boiler which is in intimate thermal contact with the thermal source, and a condenser comprised of at least one honeycomb structure containing a heat of fusion type coolant, the condenser having intimate thermal contact with vapors produced in the reflux boiler for absorbing heat from the vapors and thereby condensing the vapors back to a liquid state.

Also disclosed is a method of absorbing heat generated by a heat source which consist of the steps of transferring the heat into a reservoir of liquid coolant thereby causing the liquid coolant to boil producing vapors, placing said vapors in intimate thermal contact with a honeycomb structure containing a solid coolant for absorbing the heat from the vapors into the solid coolant and thereby condensing the vapors back to a liquid state and also melting the solid coolant, and returning the condensed liquid back to the reservoir for reheating and revaporizing.

BRIEF DESCRIPTION OF THE DRAWINGS

FIG. 1 is a front view of a high power cooler according to this invention.

FIG. 2 is a cross-section of the high power cooler of FIG. 1 as seen from the line 2—2 in FIG. 1.

FIG. 3 is a cross-section of an upper half of a second embodiment of a high powered cooler according to this invention.

DESCRIPTION OF THE PREFERRED EMBODIMENTS

Now referring to FIG. 1, a high power cooler in circular form is shown having an outer toroid 10 which encloses a honeycomb structure, the inner exposed wall of a cylindrical closed chamber 12 which is mounted between toroidal structure 10 and a second identical toroidal structure 14 (see FIG. 2). Mounted on the exposed wall of the cylinder 12 is a high power thermal source 16 which can be of any type as for example an electronic component or components.

FIG. 2 shows a cross-section of the embodiment of FIG. 1 showing the toroidal structure 10 and an identical structure 14 mounted on the other side of the cylindrical chamber 12. They contain a plurality of honeycomb cells 18 which in turn contain a heat of fusion type coolant 20 which can be of any common type such as beeswax, n-parrafyn wax, or other material well known to those skilled in the art. The choice is made considering BTU absorbed per pound of weight, cost and other properties peculiar to each of the materials. Inside the cylindrical chamber 12 is a heat of vaporization type of coolant 22 such as freon, water, menthol, etc. depending principally on the temperature of boiling as will be understood by those skilled in the art. In operation, heat generated by the high power thermal source 16 is transferred through the wall of the cylindrical chamber 12 into the coolant 22, since the coolant 22 is in intimate thermal contact with the high power thermal source 16. The heat transferred to the coolant 22 causes the coolant to boil and the heat is absorbed by the heat of vaporization of the coolant 22 forming vapors above the coolant inside the sealed cylindrical chamber 12. The vapors then come in intimate thermal contact with the honeycomb cells 18 of the toroidal encasements 10 and 14. The heat is transferred from the vapors into the heat of fusion type coolant 20 which is in intimate thermal contact with the vapors, and the heat of fusion coolant 20 melts as it absorbs heat from the vapors. The vapors in giving up their heat return to a liquid state and return into the reservoir of heat evaporation coolant 22. The return coolant is therefore ready for reheating and revaporization. Thus cylindrical chamber 12 and coolant 22 form a reflux boiler.

As is clear from FIGS. 1 and 2, this entire cooling system is rotationally symmetric about a roll axis through the center of the system perpendicular to the plane of FIG. 1. Thus, any rotation of the system about this axis does not effect the operation of the system. This allows use of this cooling system in a missile which is not roll-stabilized.

The heat of fusion coolant 20 is encased in a honeycomb structure 10 and 14 since the coolant provides a poor thermal conductive path in the liquid state and the honeycomb structure provides a large surface area of the beeswax to prevent melt fronts from thermally insulating the remaining beeswax from the heat. Since the heat of vaporization coolant 22 is able to absorb large quantities of heat rapidly, the case temperature of the electrical components as represented by the high power thermal source 16 is kept in a safe region. This rapid thermal absorption of heat is then combined with a large thermal capacity of the beeswax 20 so that large quantities of heat can be safely absorbed very rapidly. Also it is possible to reuse this high power cooler in a cyclic manner such as when testing an airborne missile prior to actual use. In this situation the high power cooler would operate to cool the electronic components during testing, and then recover between test cycles by dissipating heat from the cooler out through the skin of the missile. The thermal contact between the cooler and the skin of the missile or other cold sink is not critical but merely a trade-off between the recovery time of the cooler and other design considerations.

A second embodiment of the high power cooler is shown in FIG. 3 wherein the cooler structure 24 is shown attached in the preferred embodiment of the missile skin 26 and to a heat source 28 located opposite the missile skin approximately on the center line 29 of the missile. The cooler itself is a block structure illustrated in cross section having a horizontal lower section 30 which forms a reservoir for a liquid coolant (heat of vaporization coolant) 32. Connected to this reservoir are three vertical tubes: two tubes, 34 and 36, rise on either side of the structure, and a third tube 38 rises in the middle of the high power cooling structure. The middle tube 38 is located approximately directly above the heat source 28. Located between the middle tube 38 and the outside tubes 34 and 36 are two honeycomb structures 40 and 42. Alternate cells 44 within the honeycomb structures 40 and 42 are open at each end so that vapors can pass freely from the inner conductor 38 through the honeycomb cells 40 and 42 to the side columns 34 and 36. The other cells 46 of the honeycomb structure are closed at both ends forming a plurality of sealed chambers. Located in each of these sealed chambers is a heat of fusion type coolant 49 which in the preferred embodiment is beeswax.

The cooling system of this embodiment is a Figure of rotation of FIG. 3 about centerline 29. As will be apparent to one skilled in the art, this embodiment will be insensitive to rotation about centerline 29, as is the embodiment of FIGS. 1 and 2.

In operation, heat generated by the heat source 28, which is in intimate thermal contact with the heat of vaporization liquid 32, causes the liquid coolant 32 to boil and the vapors generated thereby rise principally in the center column 38. These vapors then disseminate through the open honeycomb cells 44 wherein their heat is transferred into the beeswax 48 such that the vapors recondense into a liquid and travel back down into the reservoir 30 principally by the side tubes 34 and 36. The heat absorbed by the beeswax 48 causes the beeswax to melt. Again the honeycomb structure is utilized to reduce the melt fronts which tend to insulate the solid beeswax 48.

The embodiments shown in FIG. 1, FIG. 2 and FIG. 3 provide means for absorbing thermal energy and therefore serve as heat storage reservoirs, principally from a high powered heat source, but can also absorb heat from other sources such as that which infiltrates from the skin of the missile. The embodiment shown in FIG. 3, like that shown in FIG. 1 and FIG. 2, can be operated in a cyclic manner. Also both embodiments can operate in a continuous manner, as for example during ground testing, if a suitable cold plate is provided to remove heat from the honeycomb structure at a sufficient rate to maintain the honeycomb structure below a given temperature.

While the invention has been particularly shown and described with reference to the preferred embodiment shown, it will be understood by those skilled in the art that various changes may be made therein without departing from the teachings of the invention. Therefore, it is intended in the appended claims to cover all such equivalent variations as come within the scope and spirit of the invention

What is claimed is:

1. A closed cooling system for dissipating heat from a thermal source comprising:
    (a) a reflux boiler having intimate thermal contact with the thermal source;
    (b) a heat of vaporization liquid coolant located in said boiler; and
    (c) a condenser comprising a first plurality of honeycomb cells containing a heat of fusion type coolant and having intimate thermal contact with vapors produced in said reflux boiler for absorbing heat from said vapors and thereby condensing said vapors back to a liquid state and melting said heat of fusion type coolant, said reflux boiler and said condenser being substantially rotationally symmetric with respect to a roll axis of said cooling system and said liquid coolant filling said reflux boiler to a point such that operation of said cooling system is substantially insensitive to rotation of said cooling system about said roll axis.

2. A closed cooling system as set forth in claim 1 wherein said heat of vaporization type coolant is freon 113, and said heat of fusion type coolant is beeswax.

3. The cooling system according to claim 1 further comprising:
    a second plurality of honeycomb cells each being in close thermal communication with at least one of said first plurality of honeycomb cells, said second plurality of honeycomb cells being in space communication with said reflux boiler for allowing said vapors to circulate through said second plurality of honeycomb cells.

4. A heat absorption and storage reservoir comprising:
    (a) a closed chamber having low thermal resistance to a thermal source;
    (b) a heat of vaporization type initially liquid coolant contained inside said closed chamber and placed so as to absorb heat produced from said thermal source for converting said liquid coolant to a vapor;
    (c) at least one section of honeycomb cells having a low thermal resistance with said closed chamber and at a spaced relationship to the thermal source; and
    (d) a heat of fusion type initially solid coolant contained in said at least one section of honeycomb cells for absorbing heat from said vapors by converting said initially solid coolant to a liquid thereby condensing said vapors back to a liquid state, said closed chamber and said at least one section of honeycomb cells being substantially rotationally symmetric with respect to a roll axis of said reservoir and said initially liquid coolant filling said closed chamber to a point such that operation of said reservoir is substantially insensitive to rotation about said roll axis.

5. The heat absorption and storage reservoir according to claim 4 further comprising:

at least a second section of honeycomb cells wherein each cell of said second section of honeycomb cells is in space communication with said closed chamber for circulation of said vapor through each of said cells of said second section of honeycomb cells and wherein said each cell is in close thermal communication with at least one cell of said at least one section of honeycomb cells.

6. A cooling system suitable for cooling electrical components in a missile comprising:

(a) a sealed enclosure containing a boilable coolant, said sealed enclosure forming a low thermal resistance path from the electrical components to said boilable coolant; and (b) at least one honeycomb structure having a low thermal resistance casing and containing a meltable coolant, said at least one honeycomb structure having intimate thermal contact with said sealed enclosure and at a spaced relationship with the electrical components such that heat generated by the electrical components flows principally into said liquid coolant wherein said liquid coolant becomes a gas which in turn transfers heat into said honeycomb structure wherein said solid coolant melts to absorb heat energy, said sealed enclosure and said at least one honeycomb structure being substantially rotationally symmetric about a roll axis of said missile and said boilable coolant filling said sealed enclosure to a point such that rotation of said missile about said roll axis has substantially no effect on said cooling system.

7. The cooling system according to claim 6 further comprising:

at least a second honeycomb structure having cells wherein each of said cells of said second honeycomb structure is in close thermal communication with at least a cell of said one honeycomb structure and wherein said cells of said second honeycomb structure are in space communication with said sealed enclosure for allowing said gas to circulate within said cells of said second section of honeycomb cells.

8. A method of absorbing heat generated by a heat source and keeping said heat source below a predetermined temperature comprising the steps of:

(a) transferring said heat into a rotationally symmetric reservoir of liquid coolant having a boiling point below the predetermined temperature causing said liquid coolant to boil to produce a vapor;

(b) placing said vapor in intimate thermal contact with a rotationally symmetric honeycomb structure containing a solid coolant for transferring heat from said vapors primarily into said solid coolant and thereby condensing said vapor back to the liquid state and melting said solid coolant; and (c) returning said condensed liquid back to said reservoir for reheating and revaporizing.

* * * * *